(12) United States Patent
Leija et al.

(10) Patent No.: US 6,880,345 B1
(45) Date of Patent: Apr. 19, 2005

(54) COOLING SYSTEM FOR AN ELECTRONIC COMPONENT

(75) Inventors: Javier M. Leija, Chandler, AZ (US); Christopher D. Lucero, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/701,727

(22) Filed: Nov. 4, 2003

(51) Int. Cl.[7] ............................................. F25B 21/02
(52) U.S. Cl. ............................ 62/3.2; 62/3.7; 62/259.2
(58) Field of Search ............................... 62/3.2, 3.3, 3.6, 62/3.7, 259.2

(56) References Cited

U.S. PATENT DOCUMENTS

| | | | |
|---|---|---|---|
| 5,676,199 A | * | 10/1997 | Lee ........................... 165/80.3 |
| 6,094,919 A | * | 8/2000 | Bhatia ........................... 62/3.7 |
| 6,289,678 B1 | * | 9/2001 | Pandolfi ........................ 62/3.2 |
| 6,326,610 B1 | * | 12/2001 | Muramatsu et al. ........ 250/238 |
| 2003/0062150 A1 | * | 4/2003 | Sweitzer et al. ....... 165/104.33 |

* cited by examiner

*Primary Examiner*—Melvin Jones
(74) *Attorney, Agent, or Firm*—Blakely, Sokoloff, Taylor & Zafman LLP

(57) ABSTRACT

A cooling system for an electronic component is provided. The cooling system includes a plurality of thermoelectric elements for placement above a plurality of different areas of the electronic component. The cooling system has a plurality of conductors connected to the thermoelectric elements for providing current to the thermoelectric elements, such that the thermoelectric elements pump heat away from the respective areas. The cooling system has a control apparatus connected to the conductors for controlling current provided to the thermoelectric elements relative to one another based on heat generated at the different areas.

28 Claims, 5 Drawing Sheets

COOLING SYSTEM FOR AN ELECTRONIC COMPONENT

BACKGROUND OF THE INVENTION

1) Field of the Invention

This invention relates generally to a computer subassembly and more specifically to a cooling system for an electronic component of a computer subassembly.

2) Discussion of Related Art

As semiconductor devices, such as processors, operate at continually higher data rates and higher frequencies, they generally consume greater current and produce more heat.

Heat spreaders, heat sinks, and fans have traditionally been provided to processors of computers. These devices cool a processor over its entire area. A semiconductor device such as a processor does not generate heat uniformly so that hot spots are created in certain areas. Power provided to the processor has to be limited so that there are no hot spots with temperatures above a predetermined temperature. More power can be provided to the entire processor if the temperatures of the hot spots can be reduced.

BRIEF DESCRIPTION OF THE DRAWINGS

The invention is described by way of examples with reference to the accompanying drawings, wherein.

DETAILED DESCRIPTION OF THE INVENTION

Figure 1:
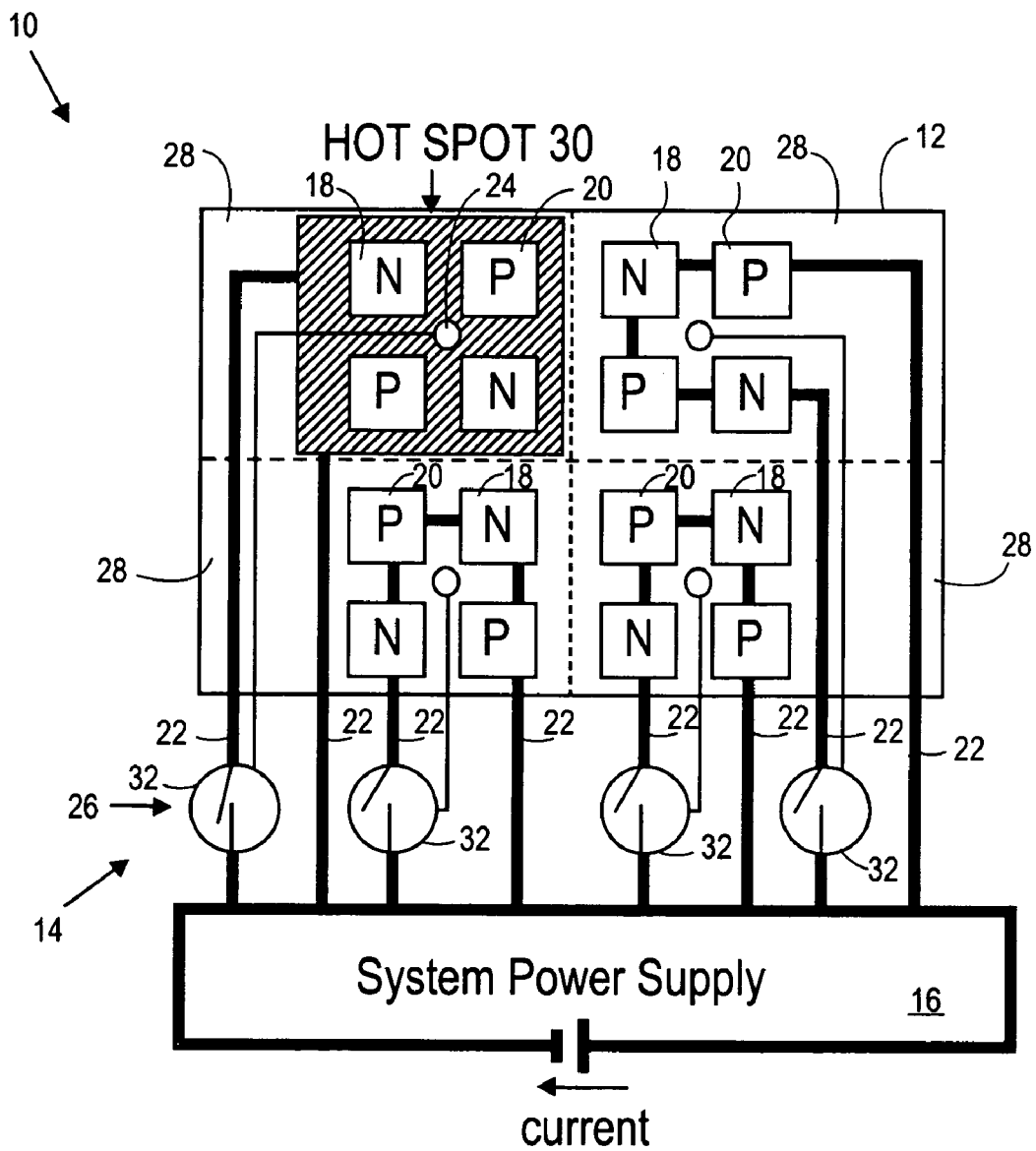
FIG. 1 is a plan view of a computer subassembly, according to an embodiment of the invention, having a cooling system that allows for cooling of individual areas of a processor of the subassembly.

FIG. 1 of the accompanying drawings illustrates a computer subassembly 10, according to an embodiment of the invention, which includes an electronic component in the form of a processor 12 and a cooling system 14. The cooling system 14 includes a system power supply 16, a plurality of n-type thermoelectric elements 18, a plurality of p-type thermoelectric elements 20, a plurality of conductors 22, a plurality of temperature sensors 24, and a control apparatus 26.

The processor 12 can be divided into rows and columns with an array of areas 28 being defined where respective rows and columns intersect. The processor 12 has an integrated circuit formed which, when operated, generates heat. The heat generated by the processor 12 may be more in some of the areas 28 than in others and may vary over time. A hot spot 30 may be created where the temperature of the processor 12 is warmer in one of the areas 28 than in other ones of the areas 28.

A plurality of the thermoelectric elements 18 and 20 are located on each respective area 28. The thermoelectric elements 18 and 20 on a particular area 28 are connected to one another in series. When current conducts through a respective series connection of the thermoelectric elements 18 and 20, the current conducts in a direction out of the paper through each one of the n-type thermoelectric elements 18 and in a direction into the paper through each one of the p-type thermoelectric elements 20. Both the n-type and p-type thermoelectric elements 18 and 20 then pump heat in a direction out of the paper, as will be commonly understood by those skilled in the art.

The set of thermoelectric elements 18 and 20 over a particular area 28 is connected to the system power supply 16 with two of the conductors 22. One of the conductors 22 provides power to a first of the thermoelectric elements 18 and 20 of a particular area 28. The other conductor 22 connects a final one of the thermoelectric elements 18 and 20 of the particular area 28 to ground or a reference voltage provided by the system power supply 16.

The temperature sensors 24 are located between the thermoelectric elements 18 and 20. Each temperature sensor 24 is located approximately in a center of a respective one of the areas 28 and is surrounded by the thermoelectric elements 18 and 20 that are located over the respective area 28. There is an equal number of areas 28 and temperature sensors 24 so that each temperature sensor 24 is located in a center of a respective one of the areas 28.

The control apparatus 26 includes a plurality of thermostats 32. Each thermostat 32 is located in a respective one of the conductors 22 providing power to the thermoelectric elements 18 and 20 over a respective area 28. There is thus an equal number of areas 28 and thermostats 32. Each one of the temperature sensors 24 is connected to a respective one of the thermostats 32. The respective thermostat 32 is closed when the temperature sensed by the temperature sensor 24 is above a predetermined temperature, and is switched to open when the temperature is below the predetermined temperature.

In use, the processor 12 is operated and may create a hot spot 30 at an area 28 where the temperature of the processor 12 is above the predetermined temperature, whereas the temperatures of other ones of the areas 28 are below the predetermined temperature. The temperature sensor 24 located on the area 28 having the hot spot 30 will detect that the temperature is above the predetermined temperature and switch the thermostat 32 to which it is connected so that current conducts through one of the conductors 22 to the series-connection of thermoelectric elements 18 and 20 located on the area 28 having the hot spot 30. Because current flows through the thermoelectric elements 18 and 20 located on the hot spot 30, the thermoelectric elements 18 and 20 will drive heat away from the hot spot 30. No current will flow through the thermoelectric elements 18 and 20 on areas 28 that are below the predetermined temperature. Only the area 28 having the hot spot 30 is thus cooled by the cooling assembly 14. An advantage is that power is conserved and that the temperature of the processor 12 can be maintained more evenly from one of the areas 28 to the next.

Figure 2:
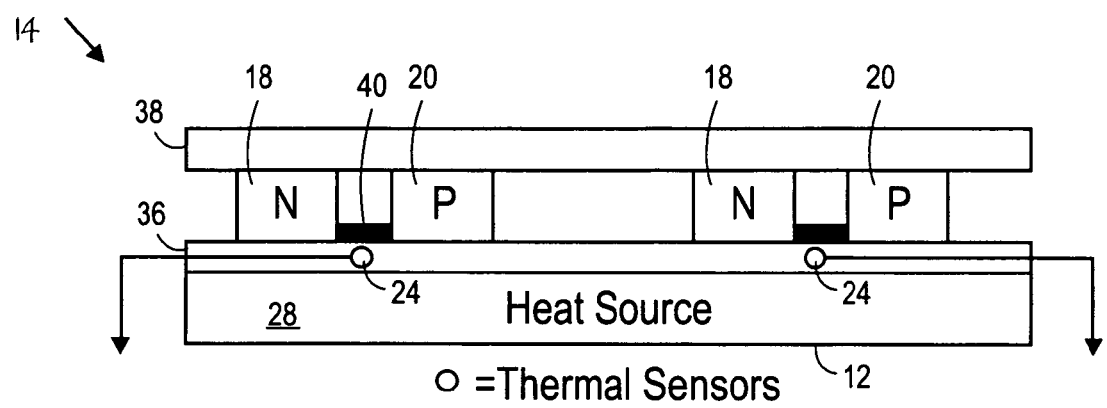
FIG. 2 is a side view of components of the computer subassembly.

As illustrated in FIG. 2, the cooling system 14 may include insulated ceramic plates 36 and 38. The thermoelectric elements 18 and 20 are mounted between the ceramic plates 36 and 38. As such, the thermoelectric elements 18 and 20 that are eventually located on all the areas 28 are located within one package. The package, including all of the thermoelectric elements 18 and 20, can be handled and transported before being mounted as a unit on top of the processor 12. The temperature sensors 24 are all attached to the ceramic plate 36, transported therewith, and the ceramic plate 36 is eventually located against the processor 12. The method still allows for heat to be removed from the processor through conduction to the thermoelectric elements 18 and 20 and out of an upper surface of the ceramic plate 38.

Figure 3:
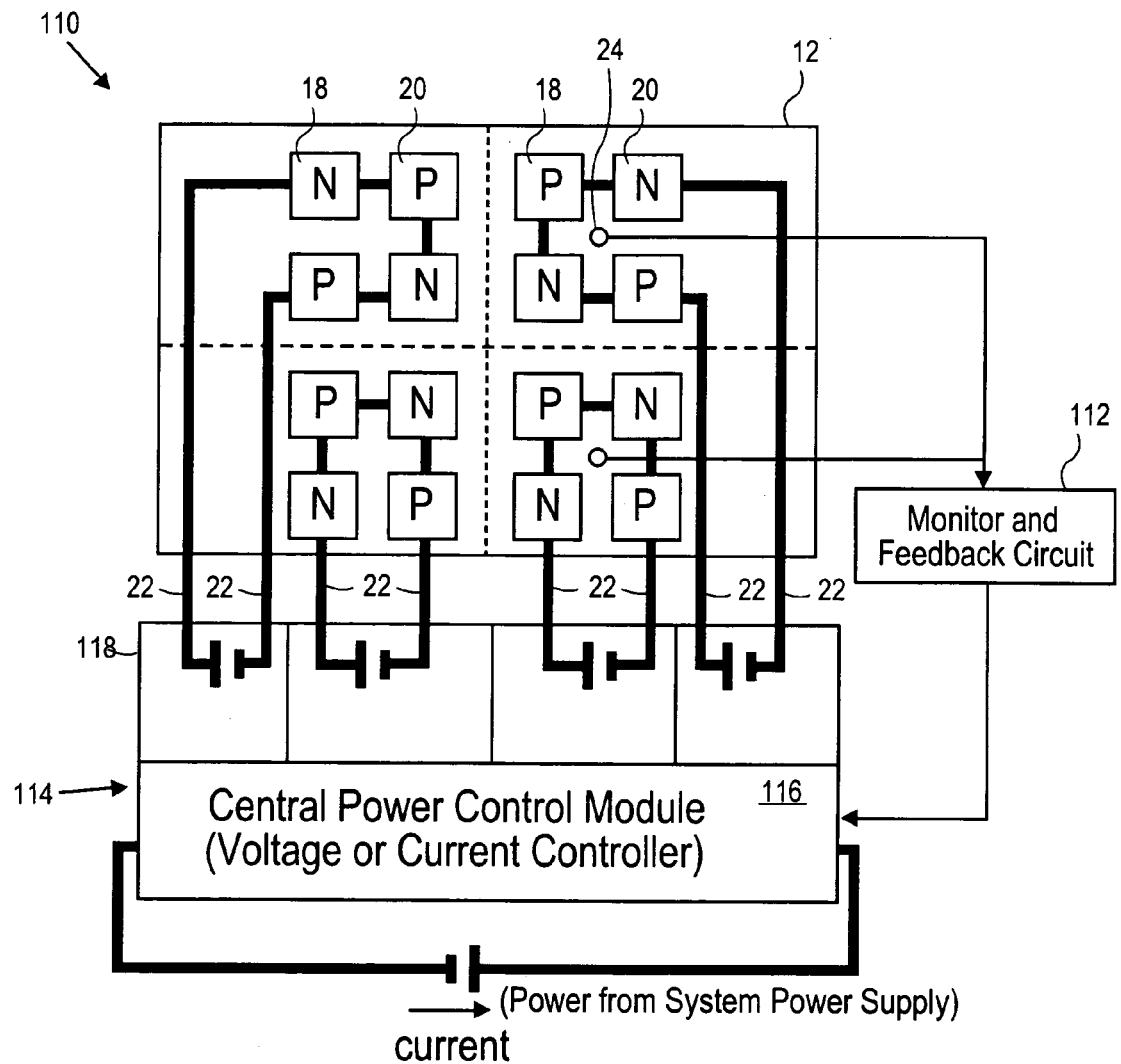
FIG. 3 is a plan view of a computer subassembly, according to another embodiment of the invention, having a cooling system with a monitor and feedback circuit that detects temperatures at individual areas on the central power control module that controls zone-power control modules.

FIG. 3 illustrates a computer subassembly 110 according to another embodiment of the invention having a monitor and a feedback circuit 112, and control apparatus 114 that includes a central power control module 116 and separate zone-power control modules 118. The computer subassembly 110 of FIG. 3 is similar to the computer subassembly 10 of FIG. 1, and like reference numerals indicate like components.

The monitor and feedback circuit 112 is connected to all the temperature sensors 24 and can monitor the temperatures sensed by the temperature sensors 24. The central power control module 116 is connected to the monitor and feedback circuit 112. The central power control module 116 is connected to the zone-power control modules 118, and can control current provided by the zone current control modules 118 individually. The central power control module 116 may have intelligence in the form of software stored thereon that can provide additional sophistication when controlling power provided by the zone-power control modules 118. For example, power provided by the zone-power control modules 118 may be gradually increased or decreased, as opposed to the on/off functioning of the thermostats 32 in FIG. 1.

Figure 4:
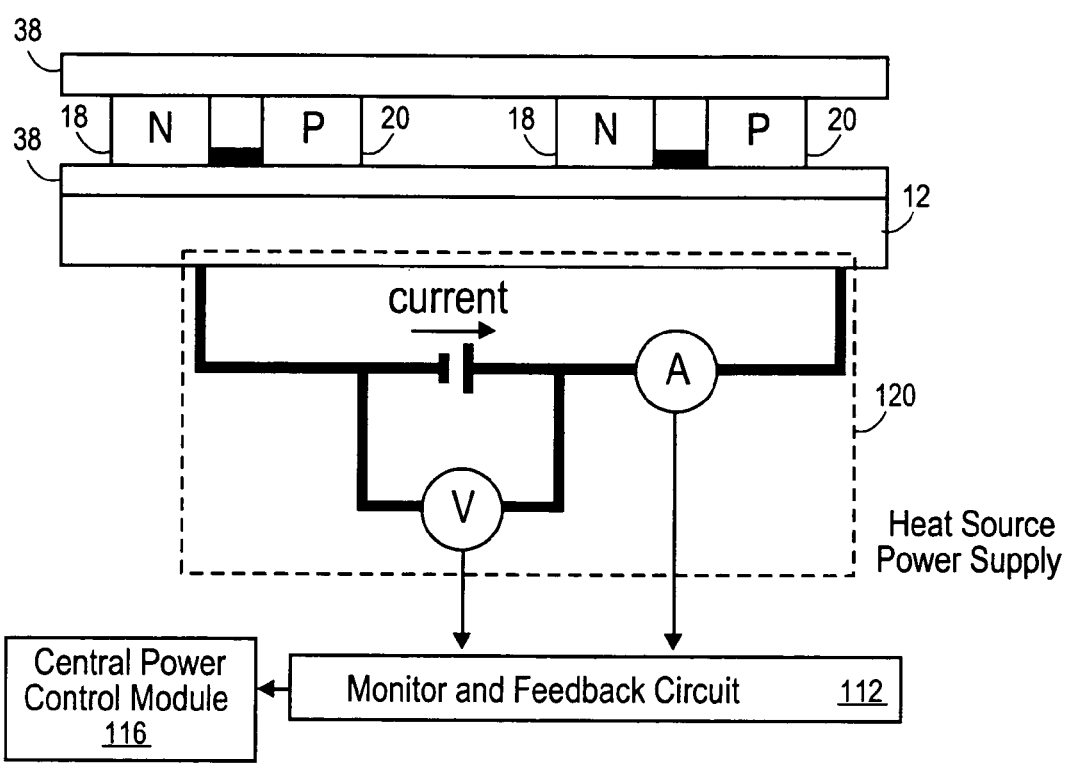
FIG. 4 is a side view of components of a computer subassembly according to a further embodiment of the invention, wherein a monitor and feedback circuit detect data relating to power provided to a processor and the processor power data is used to control of cooling of the processor.

FIG. 4 illustrates a further embodiment wherein a power monitor circuit 120 is provided to detect the power provided to the processor 12. The monitor and feedback circuit 112 is connected to the power monitor circuit 120. Data detected by the monitor and feedback circuit 112 is provided to the central power control module 116. The central power control module 116 can use the data of power provided to the processor 12. The data can then be used to control power provided to the individual sets of thermoelectric elements, thus increasing or decreasing the cooling capacity of the cooling assembly 14.

Figure 5:
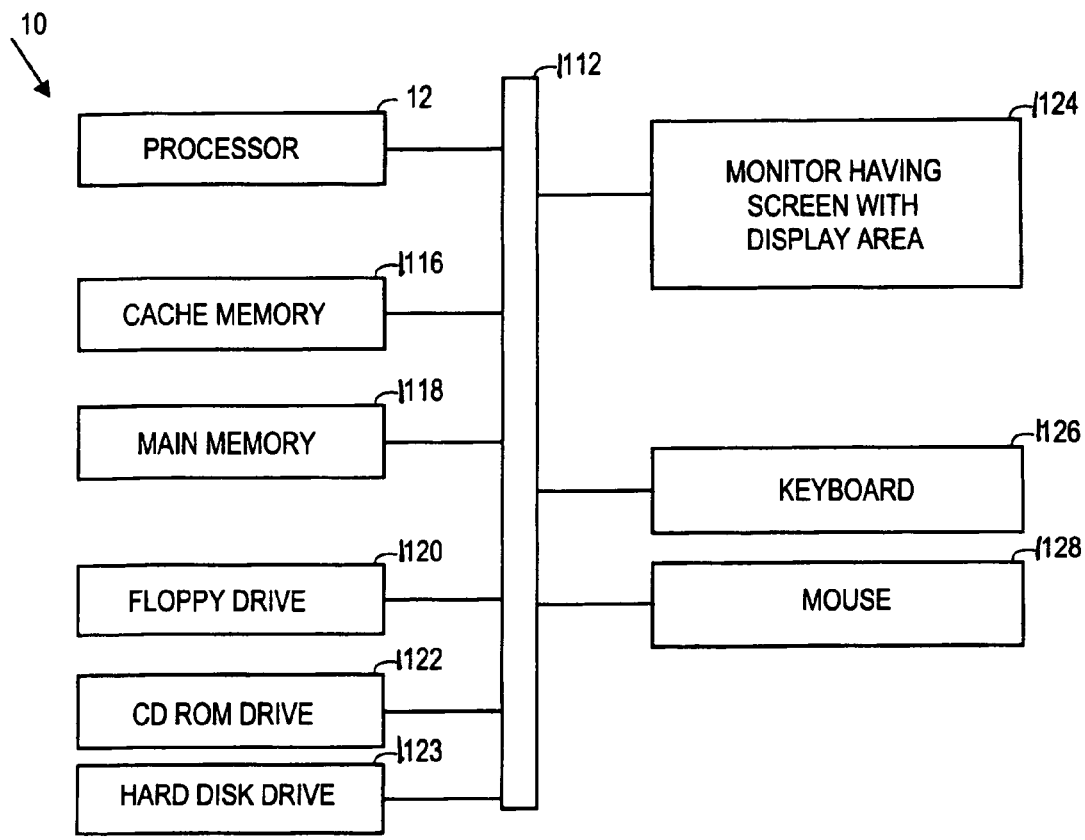
FIG. 5 is a block diagram illustrating further components of the computer subassembly.

FIG. 5 of the accompanying drawings illustrates further components of the computer subassembly 10. The computer subassembly 10 further includes a bus 1112 having connected thereto the processor 12, cache memory 1116, main memory 1118, a floppy drive 1120, a compact disk read-only-memory (CD-ROM) drive 1122, a hard disk drive 1123, a monitor 1124 having a screen with a display area, a keyboard 1126, and a mouse 1128. A list of instructions in the form of a program can be stored on, for example, a compact disk and be loaded in the CD-ROM drive 1122. The instructions of the program can be loaded into the cache memory 1116 and the main memory 1118, while more of the instructions may reside on the compact disk and on the hard disk of the hard drive. The floppy drive 1120 or the hard disk drive 1123 may be used instead of the CD-ROM drive 1122 to load instructions into the computer system subassembly 10. The instructions can be read by the processor 12 in a logical manner, which ensures proper execution of the program. A user may interact, utilizing the mouse 1128 or the keyboard 1126. A respective signal can be generated by the mouse 1128 or the keyboard 1126. The signal is sent through the bus 1112 and ultimately to the processor 12, which responds to the signal to modify an execution of the program. Execution of the program by the processor 12 results in control of how information stored in the main memory 1118, the cache memory 1116, the hard disk drive 1123, or the CD-ROM drive 1122 is displayed on the display area of the monitor 1124.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A cooling system for an electronic component, comprising:
    a plurality of thermoelectric elements to place above a plurality of different areas of the electronic component;
    a plurality of conductors connected to the thermoelectric elements to provide current to the thermoelectric elements such that the thermoelectric elements pump heat away from the respective areas; and
    a control apparatus connected to the conductors, including a plurality of thermostats that switch current to the respective thermoelectric elements off or on depending on whether the temperatures of the respective areas are above or below a predetermined set point, respectively, to control current provided to the thermoelectric elements relative to one another based on heat generated at the different areas.

2. The cooling system of claim 1, further comprising:
    a plurality of sensors, the control apparatus receiving variables from the sensors indicative of the heat generated at the different areas.

3. The cooling apparatus of claim 2, wherein the sensors are temperature sensors.

4. The cooling apparatus of claim 2, wherein the sensors are power sensors measuring power to the electronic elements.

5. The cooling system of claim 1, wherein the areas have center points that are spaced from one another in x- and y-directions.

6. The cooling system of claim 5, wherein the center points form an array.

7. The cooling system of claim 6, wherein there is a respective one of the sensors for a respective one of the areas and a respective one of the thermoelectric elements, wherein currents to the respective thermoelectric elements at the respective areas are individually controlled.

8. The cooling system of claim 7, wherein each sensor is surrounded by thermoelectric elements of a respective array.

9. A computer subassembly, comprising:
    an electronic component that generates heat when being operated;
    a plurality of thermoelectric elements placed above a plurality of different areas of the electronic component;
    a plurality of conductors connected to the thermoelectric elements for providing current to the thermoelectric elements such that the thermoelectric elements drive heat away from the respective areas; and
    a control apparatus connected to the conductors, including a plurality of thermostats that switch current to the respective thermoelectric elements off or on depending on whether the temperatures of the respective areas are above or below a predetermined set point, respectively, for controlling current provided to the thermoelectric elements relative to one another based on heat generated at the different areas.

10. The computer subassembly of claim 9, wherein the electronic component is a processor, further comprising a memory and an input/output device connected to the processor.

11. The computer subassembly of claim 9, further comprising:
a plurality of sensors, the control apparatus receiving variables from the sensors indicative of the heat generated at the different areas.

12. A method of cooling an electronic component, comprising:
providing current to a plurality of thermoelectric elements placed above a plurality of different areas of an electronic component so that the thermoelectric elements pump heat away from the respective areas; and
using a plurality of thermostats that switch current to the respective thermoelectric elements off or on depending on whether the temperatures of the respective areas are above or below a predetermined set point, respectively, to control current provided to the thermoelectric elements relative to one another based on heat generated at the different areas.

13. The method of claim 12, further comprising:
sensing a plurality of variables indicative of heat generated at the different areas, the current being controlled based on the variables.

14. The method of claim 13, wherein the variables are temperature measurements.

15. The method of claim 13, wherein the variables are power measured to the electric components.

16. The method of claim 12, wherein the thermoelectric elements over each area include alternating p- and n-type thermoelectric elements connected in series.

17. A cooling system for an electronic component, comprising:
a plurality of thermoelectric elements to place above a plurality of different areas of the electronic component;
a plurality of conductors connected to the thermoelectric elements to provide current to the thermoelectric elements such that the thermoelectric elements pump heat away from the respective areas; and
a control apparatus connected to the conductors, including a central power control module and a plurality of zone-power control modules that are under the control of the power control module to provide individual currents to the thermoelectric elements to control current provided to the thermoelectric elements relative to one another based on heat generated at the different areas.

18. The system of claim 17, wherein the control apparatus includes a central power control module and a plurality of zone-power control modules that are under the control of the power control module to provide individual currents to the thermoelectric elements.

19. The system of claim 18, wherein there is a respected one of the sensors for a respective one of the areas and a respective one of a thermoelectric element, wherein currents to the respective thermoelectric elements at the respective areas are individually controlled.

20. The system of claim 19, wherein the thermoelectric elements over each area include alternating p- and n-type thermoelectric elements connected in series.

21. A cooling system for an electronic component, comprising:
a plurality of thermoelectric elements to place above a plurality of different areas of the electronic component, the areas having center points that are spaced from one another in x- and y-directions;
a plurality of conductors connected to the thermoelectric elements to provide current to the thermoelectric elements such that the thermoelectric elements pump heat away from the respective areas; and
a control apparatus connected to the conductors to control current provided to the thermoelectric elements relative to one another based on heat generated at the different areas.

22. A computer subassembly, comprising:
an electronic component that generates heat when being operated;
a plurality of thermoelectric elements to place above a plurality of different areas of the electronic component;
a plurality of conductors connected to the thermoelectric elements to provide current to the thermoelectric elements such that the thermoelectric elements pump heat away from the respective areas; and
a control apparatus connected to the conductors, including a central power control module and a plurality of zone-power control modules that are under the control of the power control module to provide individual currents to the thermoelectric elements to control current provided to the thermoelectric elements relative to one another based on heat generated at the different areas.

23. The computer subassembly of claim 22, wherein the control apparatus includes a central power control module and a plurality of zone-power control modules that are under the control of the power control module to provide individual currents to the thermoelectric elements.

24. The computer subassembly of claim 23, wherein there is a respected one of the sensors for a respective one of the areas and a respective one of a thermoelectric element, wherein currents to the respective thermoelectric elements at the respective areas are individually controlled.

25. The computer subassembly of claim 24, wherein the thermoelectric elements over each area include alternating p- and n-type thermoelectric elements connected in series.

26. A computer subassembly, comprising:
an electronic component that generates heat when being operated;
a plurality of thermoelectric elements to place above a plurality of different areas of the electronic component, the areas having center points that are spaced from one another in x- and y-directions;
a plurality of conductors connected to the thermoelectric elements to provide current to the thermoelectric elements such that the thermoelectric elements pump heat away from the respective areas; and
a control apparatus connected to the conductors to control current provided to the thermoelectric elements relative to one another based on heat generated at the different areas.

27. A method of cooling an electronic component, comprising:
providing current to a plurality of thermoelectric elements placed above a plurality of different areas of an electronic component so that the thermoelectric elements pump heat away from the respective areas; and
using a central power control module and a plurality of zone-power control modules that are under the control of the power control module to provide individual currents to the thermoelectric elements, to control current provided to the thermoelectric elements relative to one another based on heat generated at the different areas.

28. A method of cooling an electronic component, comprising:

providing current to a plurality of thermoelectric elements placed above a plurality of different areas that are spaced from one another in x- and y-directions of an electronic component so that the thermoelectric elements pump heat away from the respective areas; and controlling current provided to the thermoelectric elements relative to one another based on heat generated at the different areas.

\* \* \* \* \*